United States Patent [19]

Shores

[11] Patent Number: 5,372,883

[45] Date of Patent: * Dec. 13, 1994

[54] DIE ATTACH ADHESIVE FILM, APPLICATION METHOD AND DEVICES INCORPORATING THE SAME

[75] Inventor: A. Andrew Shores, Venice, Calif.

[73] Assignee: Staystik, Inc., Venice, Calif.

[*] Notice: The portion of the term of this patent subsequent to Oct. 29, 2008 has been disclaimed.

[21] Appl. No.: 90,633

[22] Filed: Jul. 12, 1993

Related U.S. Application Data

[63] Continuation of Ser. No. 739,404, Aug. 2, 1991, abandoned, which is a continuation-in-part of Ser. No. 495,944, Mar. 20, 1990, Pat. No. 5,061,549.

[51] Int. Cl.$^5$ ................................................. B32B 9/00
[52] U.S. Cl. .................................. 428/323; 428/325; 428/105; 428/327; 428/411.1; 428/426; 428/704
[58] Field of Search ............... 428/323, 325, 105, 327, 428/411.1, 426, 704

[56] References Cited

U.S. PATENT DOCUMENTS

| | | | |
|---|---|---|---|
| 4,695,404 | 9/1987 | Kwong | 252/514 |
| 5,061,549 | 10/1991 | Shores | 428/207 |
| 5,204,399 | 4/1993 | Edelman | 524/404 |

FOREIGN PATENT DOCUMENTS 0051165  5/1982  European Pat. Off. .

*Primary Examiner*—Patrick J. Ryan
*Assistant Examiner*—Kam F. Lee
*Attorney, Agent, or Firm*—Shapiro and Shapiro

[57] ABSTRACT

A microelectronic device containing one or more dies bonded to a substrate 0.5-8 mil thick thermoplastic adhesive film is disclosed. The adhesive's main constituent is a thermoplastic organic high polymer containing the elements of carbon and hydrogen, and one or more of the elements oxygen, nitrogen, sulfur, halogen in its repeating unit. The polymer's Vicat softening temperature is 30°280° C., preferably 70°-230° C. The adhesive may also contain up to 45 volume percent of a thermally conductive inorganic filler of 0.5-20 micrometer particle size. The attachment process simply consists of heating and pressing the film, sandwiched between the adherent surfaces, above the melting temperature and cooling to ambient.

6 Claims, No Drawings

DIE ATTACH ADHESIVE FILM, APPLICATION METHOD AND DEVICES INCORPORATING THE SAME

This is a continuation of application Ser. No. 739,404 filed Aug. 2, 1991, now abandoned, which is a continuation-in-part of application Ser. No. 495,944 filed Mar. 20, 1990 (now U.S. Pat. No. 5,061,549 issued Oct. 29, 1991).

BACKGROUND OF THE INVENTION

Electronic devices, such as transistors, diodes, resistors, capacitors, transducers, monolithic packages, hybrid microcircuits, contain one or several dies or chips bonded onto a rigid substrate with an adhesive.

The die is a semiconductor on which all the active and passive microcircuit elements have been fabricated using one or all of the techniques of diffusion, passivation, masking, photoresist and epitaxial growth. They are usually made of doped Silicon or Gallium arsenide (Gas) and cut out with a diamond saw from wafer discs into individual dies.

The substrate provides mechanical support but may also serve useful thermal and electrical functions. It may be a ceramic, glass, sapphire, metal, quartz, epoxy, polyimide, etc. They may be bonded to a larger, rigid plate, board or case usually made of metal, ceramic, glass or high temperature plastic, providing protection, mechanical support and hermeticity. Alternatively, the substrate itself may provide, by its design, these functions.

Dies are usually fixed to the substrate with an epoxy adhesive. It is often necessary to provide thermal and electrical conductivity to the adhesive bond thus formed by the use of conductive adhesives. These are currently available as B-stage epoxy sheets coated on both sides of glass fabric for support. The epoxy adhesive presents a great number of disadvantages:

Since the epoxy is of a tacky, semi-solid consistency, it must have a glass fabric carrier in the middle and a release-coated plastic film on both sides of the sheet;

It requires freezing or refrigeration for storage;

It has to be cured or polymerized for 1–24 hours at 90°–200°;

It usually contains large quantities of ionic impurities, often up to 400 ppm $Cl^-$ and $Na^+$, which are conducive to corrosivity and hence decreased reliability of the circuit;

Once the die is bonded with the epoxy thermosetting adhesive, it is very difficult to remove them it if rework is required for some reason.

The object of this invention is to overcome these difficulties.

SUMMARY OF THE INVENTION

Accordingly, the object of this invention is to provide a microelectronic device containing one or more dies bonded to a substrate with a self-supporting adhesive film requiring no glass fabric, no release liner, no refrigeration for storage and no long curing step. An other object is to reduce ionic impurities, and to improve reworkability.

A further object is a simple application method and self supporting thermoplastic adhesive film composition used for die attachment.

These and other advantages are realized in the present invention by means of a new thermoplastic adhesive film, 0.5–8 mil thick, comprising 55–100 percent, by volume, of a thermoplastic organic high polymer containing either oxygen, nitrogen, sulfur or halogen in addition to carbon and hydrogen and having Vicat softening temperatures of 30°–280° C., and an inert inorganic particulate matter with thermal conductivity exceeding 10 W/m-°C. and average particle size of 0.5–20 micrometer, preferably 1–12 micrometer.

Die attachment comprises the following steps:

The adhesive is sandwiched between the die and the substrate or other support;

The film is heated to its melt and pressed between the preheated die and substrate for 0.001–60 minutes;

The pressure is released and the bonded assembly is cooled to ambient temperature.

DETAILED DESCRIPTION OF THE INVENTION

In accordance with the present invention, effective compositions and processes and devices can be produced to bond dies to substrates, and overcoming the difficulties encountered with the state of the art epoxy adhesive films. Some of the improvements provided by this invention are listed below:

The adhesive is self-supporting, non-tacky solid film needing no glass fabric support and release liner;

It has long shelf life at room temperature requiring no refrigeration;

Only short processing times are necessary since there is no long reaction type curing;

The adhesive of the present invention has generally considerably better ionic purity then epoxies;

Because of the adhesive's thermoplastic nature reworking is easy. One has only to apply heat and remove the die with a pair of tweezers.

The new adhesive of this invention for bonding a circuit printed substrate to its support is a self-supporting thermoplastic film of 0.5–8 mil in thickness (1 mil=0.001 inch). If the thickness is less than 0.5 mil, the resulting bond may have voids caused by unevenness and camber of the bonded surfaces, especially with larger dies. Voids decrease adhesive bond strength and heat transfer. On the other hand, adhesive thickness in excess of 8 mil takes up too much space in a microcircuit device and insulates it thermally. The preferred range of thickness is 1–3 mils.

The composition of the adhesive comprises 55–100 percent, by volume, of a thermoplastic organic high polymer containing the elements of carbon and hydrogen, and one or more of the elements oxygen, nitrogen, sulfur, halogen in its repeating unit, and having Vicar softening temperature of 30°–280° C., and 0–45 percent, by volume, of an inorganic particulate matter with thermal conductivity in excess of 10 W/m-°C. and average particle size of 0.5–20 micrometer.

The term high polymer is recognized to designate a high molecular weight polymer, one whose basic properties don't change significantly by further incremental increases in molecular weight.

In order to form a good adhesive bond, the polymer must contain in its repeating units, in addition to the elements of carbon and hydrogen, one or more of the polar elements of oxygen, nitrogen, sulfur and halogen. Such elements may be part of the main polymeric chain or attached to it as a side chain in polar groups by covalent bonds. Examples of polar groups are: carboxyl, ester, ether, nitrile, imide, amide, sulfone, chloride, fluoride, bromide.

The polymeric film is thermoplastic. Its softening temperature is measured by the ASTM method D1525 (ISO-R306)—1 kg load, and called the Vicat softening temperature. The!,, higher this temperature, the higher temperature the adhesive stays functional in the electronic device. For military, space and certain commercial applications, Vicar softening temperatures higher than 140° C. is most desirable . Exceedingly high temperatures, on the other hand, render the substrate attachment process difficult. Too low Vicar softening temperature, e.g., lower than 30° C., results in thermally unstable bond. The polymers of this invention are operative at 30°-280° C. Vicar softening temperature range. The preferred range is 30°-140° C. for devices operating at relatively low temperatures and 140-280° C. for high temperature devices. The polymers listed below and abbreviated as PSO, PCT, PBT, PAR, PEI, AND PVDF melt at 140°-280° C. and PUR, PAC, APES, CELL and ECOP melt at 30°-140° C.

Examples of thermoplastic organic high polymers according to this invention are:

Sulfone polymers, (PSO) , such as polysulfone, polyethersulfone, polyarylsulfone, and modified polysulfone. Many of these polymers may be represented by the formulas of their repeating units—O—C$_6$H$_4$—SO$_2$—C$_6$H$_4$— and C$_6$H$_4$—SO$_2$—C$_6$H$_4$—O—C$_6$ H$_4$—C(CH$_3$)$_2$—C$_6$H$_4$—

Polycarbonates, (PCT), such as —COO—C$_6$H$_4$ —C(CH$_3$)$_2$—C$_6$H$_4$—O—

Polyesters, such as polybutyleneterepthalate (PBT), aliphatic polyesters (APES);

Polyetherimides, (PEI), such as

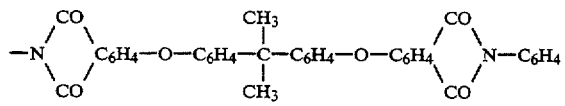

Polyarylates, (PAR), such as the bisphenol A ester of terephthalic acid;

Polyvinylidene fluoride (PVDF);

Copolymers of ethylene (ECOP) with minor amounts (less than about ¼) of maleic anhydride, methyl or ethyl acrylate, 10-35 weight percent vinyl acetate, or 3-10 weight percent of a carboxylic acid containing monomer optionally neutralized with a metal.

Polyamides of nylons;

Cellulose esters such as cellulose acetate, propionate, nitrate, and ethers, such as ethyl cellulose (CELL);

Linear phenoxy resins such as (CH$_2$—CHOH—CH$_2$—O—Ar—O—)$_n$;

Acrylic polymers (PAC), which are homo or block copolymers of alkyl esters of acrylic and methacrylic acid, optionally with up to 10% of acrylic and methacrylic acid and up to 305 styrene or vinyl acetate;

Polyurethanes, (PUR), prepared from diisocyanates and glycols, such as polyesterglycols or polyetherglycols.

The adhesive film may be made entirely of the polymer of this invention or compounded with a thermally conductive particulate matter, called filler. The amount of filler compounded with the polymer depends on a number of factors, such as the desired conductivity, particle size and other properties of the compounded adhesive. For high conductivity applications filler amounts higher than about 45 percent, by volume, results in deterioration of adhesive properties. Therefore, the invention is operative at polymer/filler volume percents of 55-100/0-45, preferably 40-100/0-40. For highly conductivity applications 25-45 volume percent filler is preferred.

Commercial films operative in this invention at zero percent filler content include PUR, PAC, ECOP, CELL and the high melting films PSO, PCT, PEI, PBT, PVDF.

The filler of this invention is a particulate material with thermal conductivity higher than about 10 W/m-°C. Such material is, for example the metals silver, gold, the ceramics alumina, beryllia, silica, silicon carbide, barium titanate, steatite, boron nitride, aluminum nitride and diamond. It must have an average particle size of 0.5-20 micrometer, preferably 1-12 micrometers.

The filler's high thermal conductivity, particle size and proportion provides high thermal conductivity for the adhesive, generally in the range of 0.7-10 W/m-°C. Without the filler the thermal conductivity is in the range of 0.2-0.3 W/m-°C.

Having thus defined the composition of the invention the following paragraphs illustrate preparation. A bonding technique is also described.

The adhesive film is prepared either by a solution process or a melt process.

In the solution process the adhesive is prepared by first dissolving the polymer in a solvent. This may be conveniently accomplished by slowly adding the polymer, in a powder, chip or pellet form to a stirring solvent. High speed stirring, low particle size and higher temperatures speed up the rate of dissolution. It may take 0.5 to 25 hours to obtain a clear solution.

Continuing stirring the polymer solution, other ingredients may then be added:
Antifoam, 0-0.5 weight percent, based on solvent;
Wetting agent, 0-2 weight percent, based on filler;
Filler of this invention, 0-45 volume percent of the adhesive;
Antioxidant, 0-2 weight percent of the polymer.

Stirring may be slow or fast depending on viscosity and stirring blade geometry. High speed stirring for 15-60 minutes may be necessary to thoroughly disperse the fillers. If excessive amount of air is entrapped in the adhesive, it is deairated by gentle tumbling or pulling vacuum over it. It is then cast on a flat surface, preferably coated with a release compound, and the solvent is driven off in an oven.

Commercial polymers that can be easily compounded in solution with fillers of this invention include PSO, PAC, PUR, PEI, APES, and CELL.

In the melt process the polymer is melted and optionally mixed with a conductive filler and other ingredients at 80°-380° C. It is then extruded at these temperatures by forcing it through a fine slot and drawing to form a film.

The adhesive bonding process comprises the following simple steps:
Positioning the adhesive film between the die and substrate. More than one layer of film may be used and more than one die may be bonded to a substrate.
Heating the film to its melt and pressing it between the die and substrate. Heat may be applied with a hot plate, oven, or induction heating. The temperature of the molten film depends on the polymer, but should be, in general, at least 50° C. higher than the Vicat softening temperature such as to obtain good flow to wet the adhering surfaces.

Pressure to the die or substrate may be applied by hand or a machine with scrubbing action. The pressure ought to be great enough and the time for pressing long enough for the adhesive to contact and wet the bonding surfaces without squeezing the adhesive out of the bond line. The higher the pressure, the lower the temperature may be for bonding, for less time. Useful pressure and time parameters are 0.0–100 pounds per square inch and 0.001 seconds to 60 minutes. If the time and temperature are adequate the weight of the die itself may be sufficient pressure.

The pressure is then released and the bonded assembly is cooled to ambient temperature to form a strong bond between the substrate and its support.

Alternatively, a microelectronic device may be fabricated with the thermoplastic film of this invention by first heat bonding the film to a wafer disc constituted of a plurality of dies, cutting up the wafer into individual dies backed with the adhesive, and heat bonding the die/adhesive laminates to a substrate, as described above.

EXAMPLE 1

A 3 mil thick polycarbonate film, sold under the trade name Lexan 8010 by General Electric Co., was analyzed and found containing less than 1 ppm Cl and $Na^+$. It had a Vicar softening temperature of 155° C.

A 0.1"×0.1" piece of film was cut and positioned between a 30 mil thick alumina substrate and an 18 mil thick gold plated on a 300° C. hot plate and pressed down with a preheated 2 ounce weight. In 3 minutes the weight was lifted and the structure was taken off the hot plate to cool.

The properties of adhesive and the bond formed were measured per MIL-STD-883C, Method 5011.1 and the following excellent results were obtained:

| Die Shear Adhesion: | |
| --- | --- |
| At 25° C. | 25 meg. N/m$^2$ |
| At 150° C. | 12 meg. N/m$^2$ |
| At 25° C. following Sequential Environment Testing (Includes 1,000 hours at 150° C. in air oven and temperature cycling 100 times between -65 and +150° C.) | 37 meg. N/m$^2$ |
| Thermal Conductivity | 0.20 W/m-°C. |
| Coef. Thermal Expansion | 60 ppm/°C. |
| Volume Resistivity | 15$^{16}$ Ohm-cm |
| Dielectric Constant | 3.17 |
| Dissipation Factor | 0.001 |
| Weight Loss (TGA) at 300° C. | 0.2% |
| Constant Acceleration Test | Pass 15000 g |
| Reworkability | Just heat to 180° C. and remove substrate with tweezers |
| Shelf Life at Room Temperature | 12 months plus |

EXAMPLE 2-3

Two commercial films, a 4 mil thick copolymer of ethylene with 6.5 weight percent acrylic acid, (EAA), having Vicat softening temperature of 85° C., and a 12 mil thick film of polybutylene terephtholate (PBT) with Vicat softening temperature of 220° C. were analyzed and found containing less than 1 ppm $Cl^-$ and $Na^+$. The films were cut to appropriate size to bond 80×80 mil Gas dies to alumina substrates, and to a moly heat sink, respectively, with PBT. The bonding and testing methods were the same as in Example 1 and the following results were obtained.

| | EAA | PBT |
| --- | --- | --- |
| Hot plate temperature, °C. | 105 | 290 |
| Force applied on bonding, psi | 9 | 0.3 |
| Bonding time at indicated temp. minutes | 0.2 | 6 |
| Shear Adhesion, meg-N/m$^2$ | | |
| at 25° C. | 12 | 31 |
| at 150° C. | — | 12 |
| at 25° C. following Sequential Environment Testing | | 38 |
| Dielectric Constant | 2.36 | 3.2 |
| Volume Resistivity, Ohm-cm | 10$^{17}$ | 10$^{16}$ |
| Dissipation Factor (10$^7$ Hz) | 0.0014 | 0.02 |
| Thermal Conductivity at 121° C., W/M-°C. | 0.19 | 0.17 |
| Weight Loss (TGA) at 300° C. | — | 0.5 |
| Coefficient of Thermal Expansion, -55 to 150° C. ppm/°C. | — | 89 |
| Reworkability | Excellent at 105° C. | Excellent at 225° C. |
| Constant Acceleration Test | Pass 25000 g | Pass 15000 g |
| Shelf life of adhesive at room temperature, months | 12+ | 12+ |

EXAMPLES 4

100 g polysulfone pellets, having a Vicat softening temperature of 190° C. and sold under the trade designation Udell 3703 by Amoco Chemical Co., was stirred into 250 g. o-dichlorobenzene heated in a 500 ml. glass beaker to 80° C. with a hot plate to obtain a clear, viscous solution in about 4 hours. The total solids was 28.6% and the viscosity 20,000 cps (Brookfield viscometer, 3.75 per second shear rate). The following ingredients were then stirred into the solution, in order:

| | |
| --- | --- |
| o-dichlorobenzene, | 50.0 |
| Dehydran ARA 7219, an antifoam sold by Henkell Corp. | 0.05 |
| P-211 silver flake-powder mixture, average particle size 5 micrometer, thermal conductivity = 419 W/m-°C. sold by Englehard Corp. | 376.0 |

The mixture was further stirred at 2,000 rpm for half an hour. The total solids of the paste was 61 weight percent and viscosity 12,500 cps at 37.5 per second shear rate. The silver constituted 79 weight percent and 31 volume percent of the adhesive's solids. The adhesive was then drawn between two rolls on a silicone coated paper release liner and dried in a vacuum oven at room temperature for 2 hours and at 150° C. for 16 hours to a dry thickness of 3 mil. The properties of the adhesive and the bond were measured as in Example 1 to obtain the following results:

| Die Shear Adhesion: | |
| --- | --- |
| At 25° C. | 26 meg. N/m$^2$ |
| At 150° C. | 19 meg. N/m$^2$ |

| | |
|---|---|
| At 25° C. following Sequential Environment Testing | 38 meg. N/m² |
| Electrical Conductivity at 25° C. | 10⁻⁴ Ohm-cm |
| Thermal Conductivity at 121° C. | 3 W/m-°C. |
| Weight Loss (TGA) at 300° C. | 0.3% |
| Coefficient of Thermal Expansion, -55 to 150° C. | 40 ppm/°C. |
| Reworkability | Excellent - just heat to 220° C. and remove substrate with tweezers |
| Shelf Life of adhesive at room temperature | 12 months plus |
| Leachable Chloride | 5 ppm |
| Leachable Sodium | 1 ppm |

EXAMPLE 5

350 g of polysulfone solution prepared as in Example 4 was compounded as in Example 4 with alumina as follows to provide thermal conductivity and maintaining electrical insulating properties:

| | |
|---|---|
| Dehydran ARA 7219 | 0.05 |
| Alumina, particle size 8 micrometer, thermal conductivity = 34 W/m-°C. | 200 |
| Irganox 1010 antioxidant | 0.2 |

The total solids of the paste was 55.2 weight percent, and the Brookfield viscosity 42,000 cps at 37.5 per second shear rate. The alumina constituted 67 weight percent and 38 volume percent of the adhesive's solids.

The adhesive was applied and tested as in Example 1, and the following excellent properties were obtained:

| | |
|---|---|
| Die Shear Strength | |
| At 25° C. | 28 meg. N/m² |
| At 150° C. | 21 meg. N/m² |
| At 25° C. following Sequential Environment Testing | 44 meg. N/m² |
| Thermal Conductivity | 0.96 W/m-°C. |
| Weight Loss (TGA) at 300° C. | 0.3% |
| Coefficient of Thermal Expansion | 40 ppm/°C. |
| Volume Resistivity | 10¹⁴ Ohm-cm |
| Dielectric Constant | 3.9 |
| Dissipation Factor | 0.01 |
| Weight Loss (TGA) at 300° C. | 0.3% |
| Reworkability | Heat to 220° C. and remove substrate with tweezers |
| Shelf Life at room temperature | 12 months plus |

EXAMPLES 6-10

Adhesives of various compositions were prepared comprising the ingredients listed in Table I following the procedure described in Example 4. They were then used to bond silicon dies to circuit printed substrates and tested as in Example 1. All the adhesives had excellent properties, e.g., self supporting, not tacky at room temperature, long shelf life, high ionic purity, excellent adhesion good thermal conductivity, and excellent reworkability.

TABLE 1
ADHESIVE COMPOSITION AND PROPERTIES OF EXAMPLES 6-10

| | Polymer | | | Conductive Filler | | | | |
|---|---|---|---|---|---|---|---|---|
| Ex. | Type | Vicat | % | Type | Size | TC | % | Substrate |
| 6 | PUR | 85 | 39 | Au | 5 | 298 | 61 | BeO |
| 7 | PEI | 220 | 35 | AlN | 9 | 180 | 65 | AlN |
| 8 | PES | 180 | 41 | SiO₂ | 15 | 16 | 59 | Al₂O₃ |
| 9 | PAR | 150 | 29 | BN | 0.8 | 50 | 71 | BN |
| 10 | PAC | 55 | 32 | SiC | 2 | 70 | 68 | SiC |

Abbreviations
Size: Particle Size in Micrometers;
%: Volume percent in adhesive film;
TC: Thermal Conductivity W/m-°C.;
Vicat: Vicat Softening Temperature, °C;
PUR: Polyurethane;
PEI: Polyetherimide;
PES: Polyethersulfone;
PAR: Polyarylate;
PAC: Methylmethacrylate/Ethylacrylate/Acrylic Acid Copolymer, Tg = 70° C.;
SS: Stainless Steel;
Kovar: Commercial Alloy of Fe + Co + Ni.

I claim:

1. A microelectronic device containing one or more dies bonded to a substrate with a self supporting adhesive film 0.5-5 mil thick, said adhesive comprising:
   55-100 percent by volume of a thermoplastic organic high polymer containing the elements of carbon and hydrogen, and one or more of the elements oxygen, nitrogen, sulfur, and halogen in its repeating unit, and having Vicat softening temperature of 30°-280° C., said polymer being selected from the group consisting of copolymers of ethylene with minor amounts of a carboxylic acid-containing monomer or ester thereof, an anhydride, or vinyl acetate, and 0-45 percent by volume of an inorganic particulate filler with thermal conductivity in excess of 10 W/m-°C. and average particle size of 0.5-20 micrometer.

2. A device as in claim 1, wherein the carboxylic acid-containing monomer or ester is selected from the group consisting of acrylic acid, methacrylic acid, methyl acrylate, and ethyl acrylate.

3. A device as in claim 1, wherein the anhydride is maleic anhydride.

4. A device as in claim 1, wherein the amount of filler is 0%.

5. A device as in claim 1, wherein the amount of filler is 25-45 volume %.

6. A device as in claim 1, wherein said filler is selected from the group consisting of silver, gold, and ceramics.

* * * * *